United States Patent
Jung et al.

(10) Patent No.: US 9,196,337 B2
(45) Date of Patent: Nov. 24, 2015

(54) LOW SENSING CURRENT NON-VOLATILE FLIP-FLOP

(75) Inventors: Seong-Ook Jung, Gyeongggi-Do (KR); Youngdon Jung, Gyeongggi-Do (KR); Kyungho Ryu, Seoul (KR); Jisu Kim, Seoul (KR); Jung Pill Kim, San Diego, CA (US); Seung H. Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 365 days.

(21) Appl. No.: 13/613,205

(22) Filed: Sep. 13, 2012

(65) Prior Publication Data

US 2013/0286721 A1    Oct. 31, 2013

Related U.S. Application Data

(60) Provisional application No. 61/638,207, filed on Apr. 25, 2012.

(51) Int. Cl.
*G11C 11/16* (2006.01)
*G11C 7/06* (2006.01)
*G11C 14/00* (2006.01)

(52) U.S. Cl.
CPC ............ *G11C 11/1673* (2013.01); *G11C 7/065* (2013.01); *G11C 14/0081* (2013.01)

(58) Field of Classification Search
CPC . G11C 11/1673; G11C 7/065; G11C 14/0081

USPC .......................................... 365/154, 203, 158
See application file for complete search history.

(56) References Cited

U.S. PATENT DOCUMENTS

| | | | |
|---|---|---|---|
| 6,717,844 B1 * | 4/2004 | Ohtani ......................... | 365/158 |
| 6,781,910 B2 | 8/2004 | Smith | |
| 6,944,050 B2 * | 9/2005 | Kang et al. .................... | 365/158 |
| 7,206,223 B1 | 4/2007 | Nahas et al. | |
| 7,280,388 B2 | 10/2007 | Nahas | |

(Continued)

FOREIGN PATENT DOCUMENTS

WO    2010007173 A1    1/2010

OTHER PUBLICATIONS

International Search Report and Written Opinion—PCT/US2013/037764—ISA/EPO—Jul. 31, 2013.

*Primary Examiner* — Douglas King
(74) *Attorney, Agent, or Firm* — Chui-kiu Teresa Wong; Paul Holdaway

(57) ABSTRACT

A low sensing current non volatile flip flop includes a first stage to sense a resistance difference between two magnetic tunnel junctions (MTJs) and a second stage having circuitry to amplify the output of the first stage. The output of the first stage is initially pre-charged and determined by the resistance difference of the two MTJs when the sensing operation starts. The first stage does not have a pull-up path to a source voltage (VDD), and therefore does not have a DC path from VDD to ground during the sensing operation. A slow sense enable (SE) signal slope reduces peak sensing current in the first stage. A secondary current path reduces the sensing current duration of the first stage.

8 Claims, 14 Drawing Sheets

(56) References Cited

U.S. PATENT DOCUMENTS

| | | | |
|---|---|---|---|
| 7,733,145 B2* | 6/2010 | Abe | G11C 14/0081 327/218 |
| 7,961,005 B1* | 6/2011 | Kim | G11C 14/0054 326/38 |
| 8,194,438 B2* | 6/2012 | Ahn et al. | 365/158 |
| 2005/0122769 A1* | 6/2005 | Miyatake et al. | 365/158 |
| 2007/0063236 A1 | 3/2007 | Huai et al. | |
| 2010/0265760 A1 | 10/2010 | Sakimura et al. | |
| 2012/0020159 A1* | 1/2012 | Ong | 365/185.08 |
| 2014/0056059 A1* | 2/2014 | Mueller et al. | 365/158 |

* cited by examiner

LOW SENSING CURRENT NON-VOLATILE FLIP-FLOP

CROSS REFERENCE TO RELATED APPLICATION

The present application claims the benefit of U.S. Provisional Patent Application No. 61/638,207 to Jung et al. entitled Low Sensing Current Non-Volatile Flip-Flop filed Apr. 25, 2012, the disclosure of which is expressly incorporated herein by reference in its entirety.

TECHNICAL FIELD

The present disclosure generally relates to magnetic tunnel junction (MTJ) devices. More specifically, the present disclosure relates to MTJ sensing circuitry in low current non-volatile flip flops.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnification or "0" when the free layer magnetization is parallel to the fixed layer magnitization or vice versa. One such device having a fixed layer, a tunneling layer, and a free layer is a magnetic tunnel junction (MTJ). An MTJ normally also includes top and bottom electrode and may be formed with or without an antiferromagnetic layer to pin the fixed layer. The electrical resistance of an MTJ depends on whether the free layer magnetization and fixed layer magnetization are parallel or anti-parallel with each other. A memory device such as Spin-Transfer Torque (STT) MRAM is built from an array of individually addressable MTJs.

To write data in STT MRAM, a write current with a specific direction of write "1" or "0", which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In STT MRAM, two distinct states are defined be two different resistances of an MTJ in a bitcell of the MRAM. The two different resistances represent a logic "0" and a logic "1" value stored by the MTJ.

Magnetic tunnel junctions (MTJs) can be used to construct non-volatile flip-flop structures (NVFF). Sensing circuitry in non-volatile flip flop structures have included cross-coupled inverter configurations in which two magnetic tunnel junctions (MTJs) are embedded in the cross-coupled inverter. FIG. 1 shows sense amplifier circuitry 100 that has been proposed for sensing the state of MTJs in a flip flop circuit as described in Weisheng Zhao, Eric Belbaire, Claude Chappert, "Spin-MTJ based Non-Volatile Flip-Flop", *Proc. Of IEEE International Conference on Nanotechnology (IEEE-NANO)*, Hongkong, China, 2007. pp. 399-402, ISBN: 978-1-4244-0607-4, DOI: 10.1109/NANO.2007,4601218. Because this sense amplifier circuitry 100 is less precise than a standard, more complex MRAM sense amplifier, two complementary MTJs are used for each bit to increase robustness. A sense operation is performed by briefly turning on the NMOS transistor MN2 and then promptly turning it off. In FIG. 1, SE is the read control (sense enable) signal.

FIG. 2 shows a pre-charged sense amplifier (PCSA) 200 that has been proposed in Weisheng Zhao, Claude Chappert, Virgile Javerliac and Jean-Pierre Noiziére, "High speed, high stability and low power sensing amplifier for MTJ/CMOS hybrid logic circuits", *IEEE Transaction on Magnetics*, Vol. 45, October 2009, pp. 3784-3787. DOI: 10.1109/TMAG.2009.2024325. The pre-charge sense amplifier 200 includes two inverters (MP0, MN0 and MP1, MN1), two PMOS transistors (MP2, MP3) in parallel with MP0 and MP1, respectively, and one NMOS transistor MN2 connecting the circuit with ground (GND). The pre-charge sense amplifier 200 uses two operating phases depending on the control signal SE.

When SE is set to 0, the pre-charge sense amplifier precharges the polarization voltages (V0 and V1) of the two MTJs. There is no stationary current in the circuit because MN2 is closed. As SE is then set from 0 to 1, the pre-charged voltages begin to discharge. Because the two MTJs have different resistances, the discharge speed will be different for each branch. For example, if ferromagnetic layers of MTJ1 are anti-parallel and those of MTJ2 are parallel, the resistance of MTJ1 is greater than the resistance of MTJ2 and the discharge current through MTJ2 will be higher than the discharge current through MTJ1. During this discharge, a voltage Qm will be reduced faster than Qm bar. When Qm becomes less than the threshold switching voltage of the inverter amplifier composed of MP1 and MN1, Qm bar will be charged to the Vdd logic level, representing logical 1 and Qm will continue the discharge process down to 0.

The pre-charge sense amplifier circuitry shown in FIG. 2 was proposed to have very low power consumption because only current for charging or discharging capacitors should flow through the pre-charge sense amplifier circuitry. However, this structure actually includes a DC path from VDD to GND during the sensing operation, which allows a large sensing current to pass through the MTJs. This large sensing current can then cause read disturbance that may write unwanted data to the MTJs.

BRIEF SUMMARY

According to an aspect of the present disclosure, a magnetic tunnel junction (MTJ) flip flop apparatus includes a first stage having a first MTJ and a second MTJ coupled to the first MTJ. The first stage includes a first low current sense path from a first precharge node through the first MTJ and a second low current sense path from a second precharge node through the second MTJ. The apparatus also includes a second stage having a third current sense path from a supply voltage node to a ground node via a first second stage transistor and a fourth current sense path from the supply voltage to the ground node via a second second stage transistor.

According to another aspect of the present disclosure, a low current magnetic tunnel junction (MTJ) flip flop sensing method includes simultaneously enabling a first sensing current from a pre-charged first first stage output node through a first MTJ and a second sensing current from a second first stage output node through a second MTJ.

Another aspect of the present disclosure includes a method of constructing a low current magnetic tunnel junction (MTJ) flip flop apparatus. The method includes coupling a first MTJ to a second MTJ, and coupling a first low current sense path from a first precharge node through the first MTJ. The method further includes coupling a second low current sense path from a second precharge node through the second MTJ, and coupling a third current sense path from a supply voltage node to a ground node via a first second stage transistor. The method also includes coupling a fourth current sense path from the supply voltage node to the ground node via a second second stage transistor, coupling a first second stage transistor gate of the first second stage transistor to the second precharge node, and coupling the second second stage transistor gate of the second second stage transistor to the first precharge node.

According to another aspect of the present disclosure, a low current magnetic tunnel junction (MTJ) flip flop sensing apparatus includes means for simultaneously enabling a first sensing current from a pre-charged first first stage output node through a first MTJ and a second sensing current from a second first stage output node through a second MTJ.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 3A:
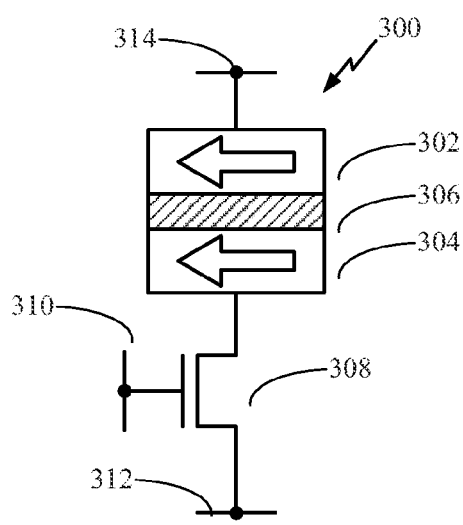
FIGS. 3A-3B are schematic circuit diagrams of an MTJ device structure in a first state and a second state.
Figure 3B:
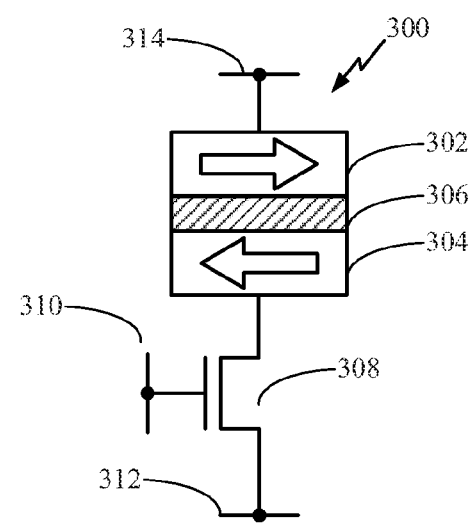

A magnetic tunnel junction (MTJ) structure is described with reference to FIGS. 3A and 3B in which FIG. 3A shows a magnetic tunnel junction 300 in a first state and FIG. 3B shows the magnetic tunnel junction 300 in a second state. The magnetic tunnel junction 300 includes two magnetic layers, the free layer 302 and the pined layer 304, and an insulating layer 306, e.g., a MgO barrier between the free layer 302 and the pinned layer 304. The MTJ 300 is coupled between a bit line 314 and a selecting transistor 308. The selecting transistor is coupled to a source line (SL) 312 and controlled by a word line (WL) 310.

The electrical resistance of the MTJ ($R_{MTJ}$) depends on the state of the MTJ 300. The MTJ 300 has low resistance when the magnetic orientations of the free layer 302 and pinned layer 304 are in the same direction (parallel) as shown in FIG. 3A. The MTJ has high resistance when the magnetic orientations of the free layer 302 and the pinned layer 304 are in different direction (anti-parallel) as shown in FIG. 3B.

The state of the MTJ 300 depends on the direction of a write current applied through the MTJ during a write operation. If a write current flows from free layer 302 to fixed layer 304 a parallel state (state0) is written to the MTJ 300. If write current flows from fixed layer 304 to free layer 302, an anti-parallel state (state1) is written to the MTJ 300.

Figure 1:
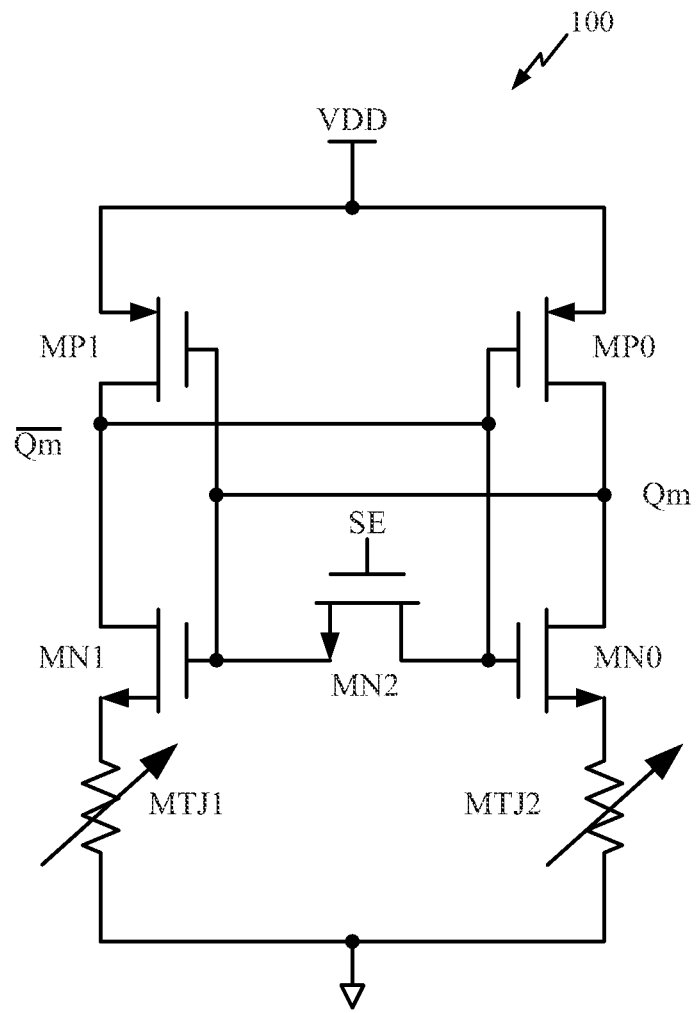
FIG. 1 is a schematic circuit diagram showing prior art sense amplifier circuitry for sensing a state of magnetic tunnel junctions (MTJs) used in a flip flop circuit.
Figure 2:
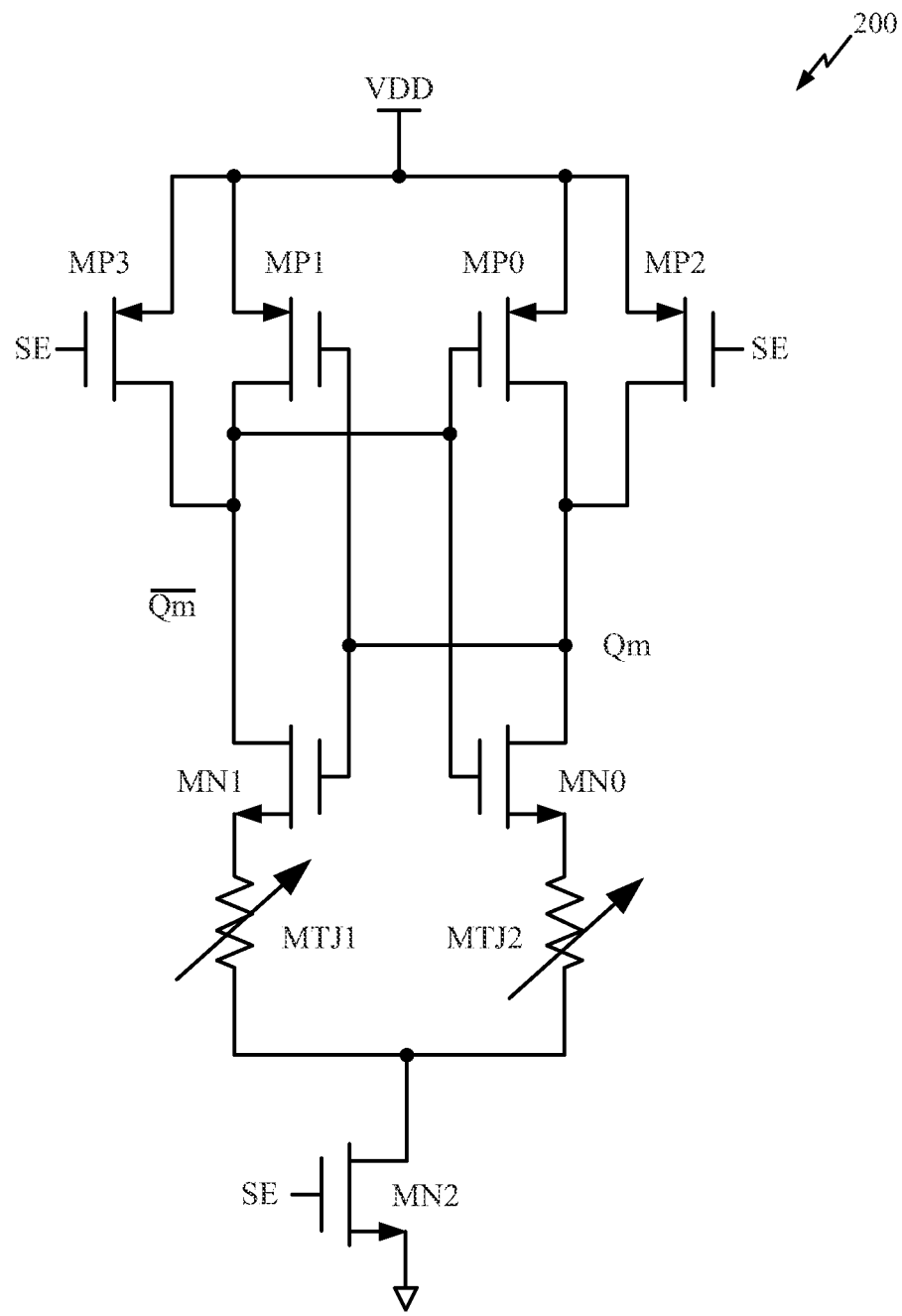
FIG. 2 is a schematic circuit diagram showing prior art pre-charge sense amplifier (PCSA) circuitry for sensing the state of MTJs used in a flip flop circuit.
Figure 4:
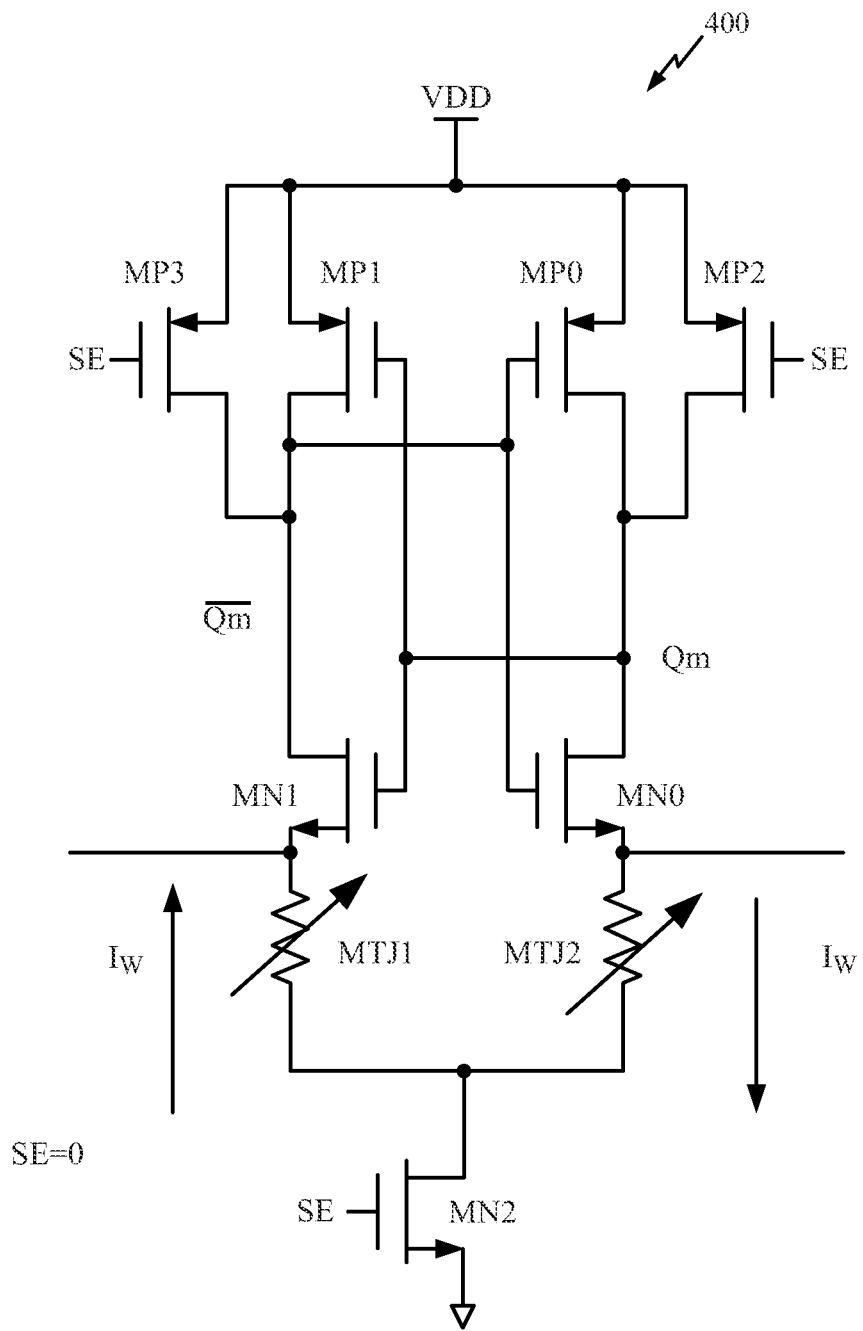
FIG. 4 is a schematic circuit diagram showing write currents in a pre-charge sense amplifier (PCSA) apparatus according to aspects of the present disclosure.

Referring to FIG. 4, a process of writing to two MTJs configured with pre-charge sense amplifier (PCSA) circuitry 400, such as the pre-charge sense amplifier shown in FIG. 2, is described. During a write operation, a write current ($I_W$) flowing in the direction shown flows from the free layer to the fixed layer of MTJ2, which causes a parallel state (state0) of MTJ2. The write current ($I_W$) flowing through MTJ1 in the direction shown flows from the fixed layer to the free layer of MTJ1, which causes an anti-parallel state (state1) of MTJ1.

Figure 5:
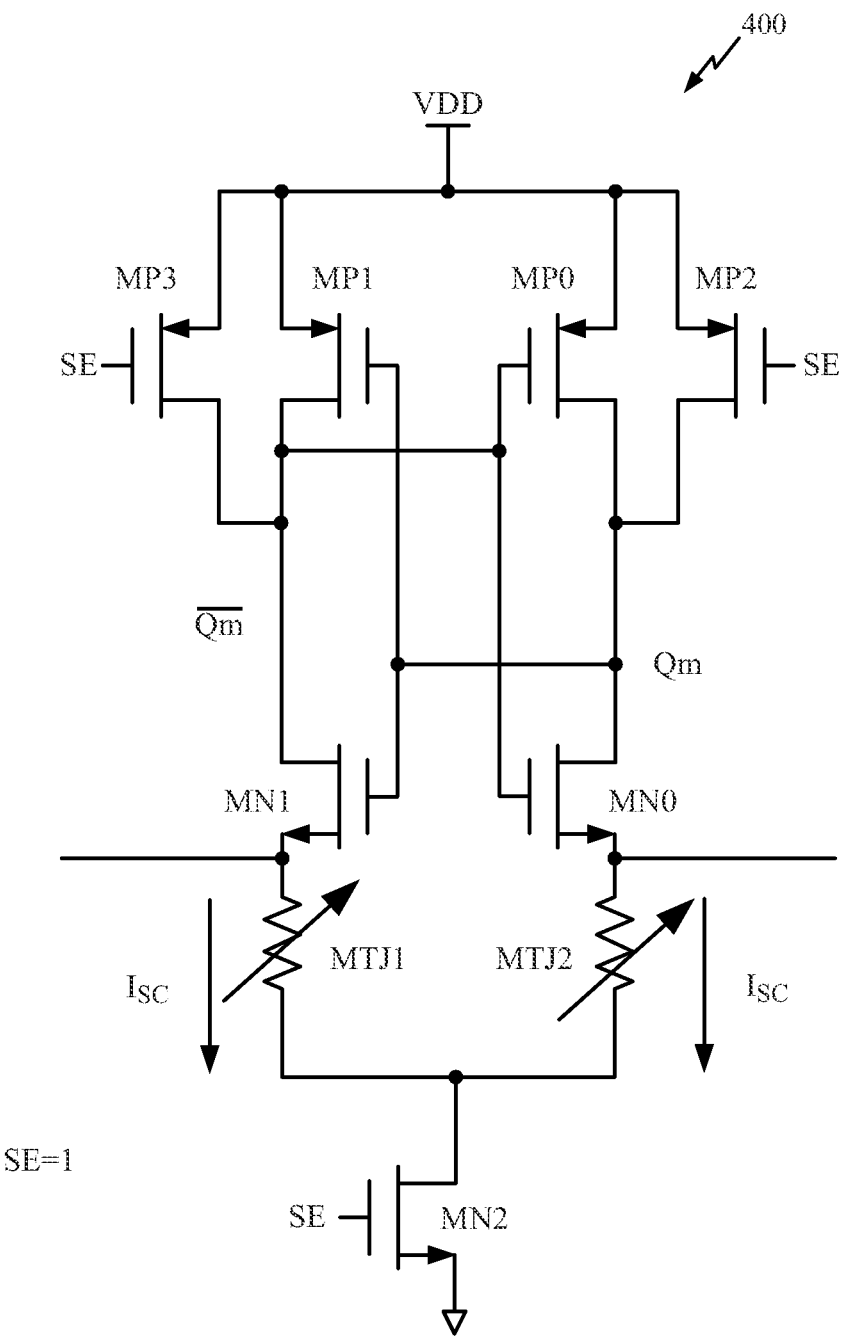
FIG. 5 is a schematic circuit diagram showing sense currents in a pre-charge sense amplifier apparatus.

The state of an MTJ can be disturbed by a read operation if a sensing current to sense a resistance of the MTJ exceeds a critical current. Referring to FIG. 5, two MTJs of the pre-charge sense amplifier circuitry 400 are shows in which the sensing current ($I_{SC}$) flows from the free layer to the fixed layer of the MTJs. This current direction is the same as the direction for writing stated to the MTJs. Thus, the read disturbance can occur at MTJ1 with state1, in effect changing the state to state0.

Statistical simulation can verify the effect of reduced sensing current on read disturbance pass yield (RDPY). The probability of the read disturbance pass can be obtained using distributions of the sensing current (N($\mu$ Iread,$\sigma$ Iread2)) and the critical current (N($\mu$ Ic,$\sigma$ Ic2)).

The read disturbance pass yield, $RDPY_{SINGLE}$, in sigma for a single flip-flop (FF) is:

$$RDPY_{SINGLE} = \frac{\mu_{I_c} - \mu_{I_{read}}}{\sqrt{\sigma_{I_C}^2 + \sigma_{I_{read}}^2}} \text{(sigma)}.$$

The probability for a single flip flop using $RDPY_{SINGLE}$ is:

$$P_{RDPY_{SINGLE}} = \Phi(RDPY_{SINGLE})(\%),$$

The yield for N flip flops is:

$$\text{yield} = (P_{RDPY_{SINGLE}})^{N_{FF}}(\%),$$

where $\mu_{Idata1}$ ($\mu_{Ic+}$) is the mean of $I_{data1}$ ($I_{C+}$), and $\sigma_{Idata1}$ ($\sigma_{Ic+}$) is the standard deviation of $I_{data1}$ ($I_{C+}$), and $\Phi(x)$ is the cumulative distribution function (CDF) of the normalized Gaussian random variable.

Figure 6:
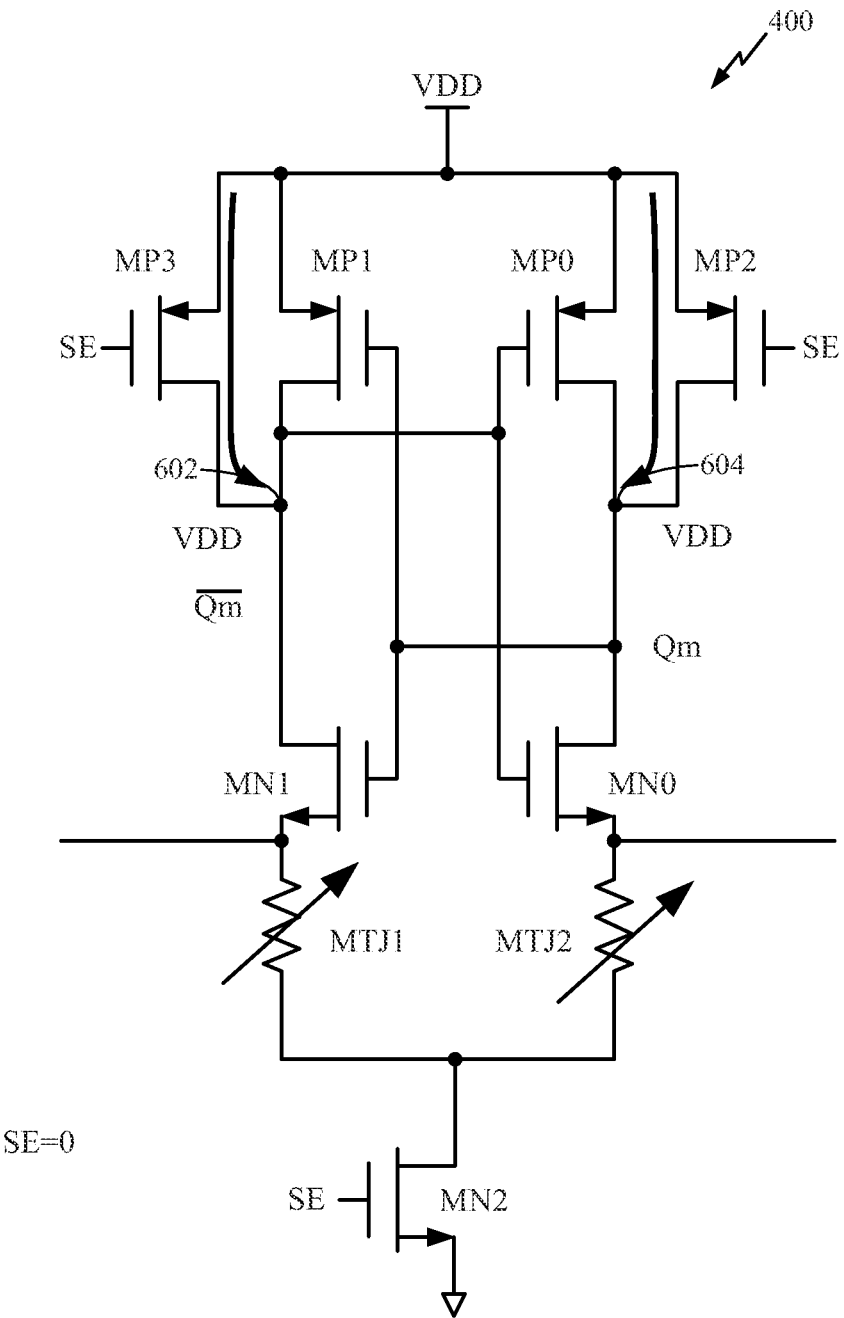
FIG. 6 is a schematic circuit diagram showing operation of a pre-charge sense amplifier apparatus.
Figure 7:
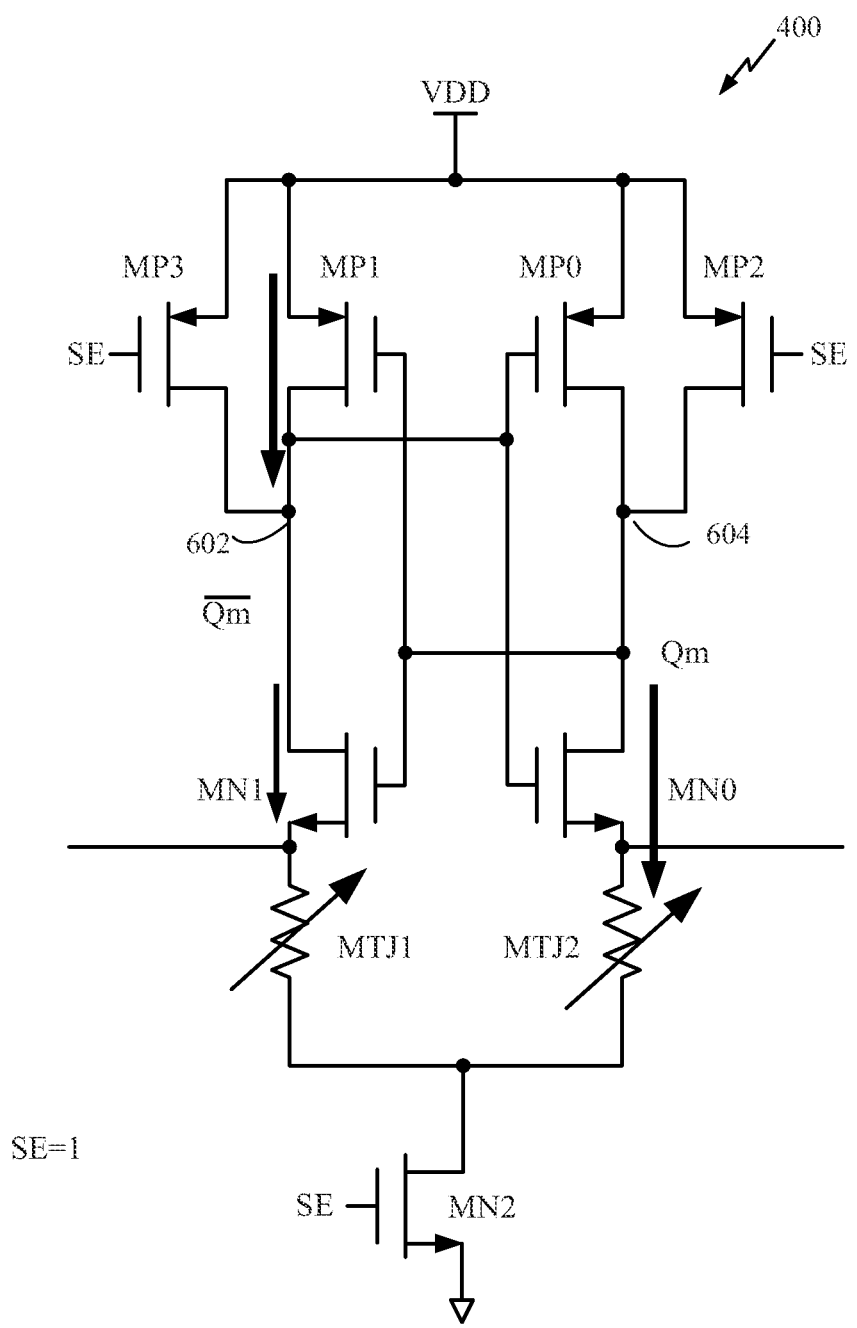
FIG. 7 is a schematic circuit diagram showing operation of a pre-charge sense amplifier apparatus.

Operation of a pre-charge sense amplifier apparatus 400 is described with reference to FIGS. 6 and 7. Referring to FIG. 6, a sense enable node (SE) begins at logic level 0, in which two output nodes 602, 604 of the pre-charge sense amplifier apparatus 400 are precharged. Referring to FIG. 7, the sense enable node (SE) of the pre-charge sense amplifier apparatus 400 transitions from 0 to 1 and two outputs are sensed at the output nodes 602, 604 by the current difference determined by a resistance difference between MTJ1 and MTJ2. If MTJ2 has lower resistance than MTJ1, Qm will be reduced tar than Qm bar. Then MP1 will turn on and Qm bar will rise to VDD. This creates a direct current path from VDD to ground resulting in a large sensing current that can cause read disturbance of the MTJs.

Aspects of the present disclosure include magnetic tunnel junction (MTJ) flip flop circuitry configured with low current sensing circuitry. A two-stage sensing circuitry configuration prevents a direct current path from VDD to ground during sensing operations. Aspects of the present disclosure also provide a slow sense enable (SE) signal slope and a secondary current path.

Figure 8:
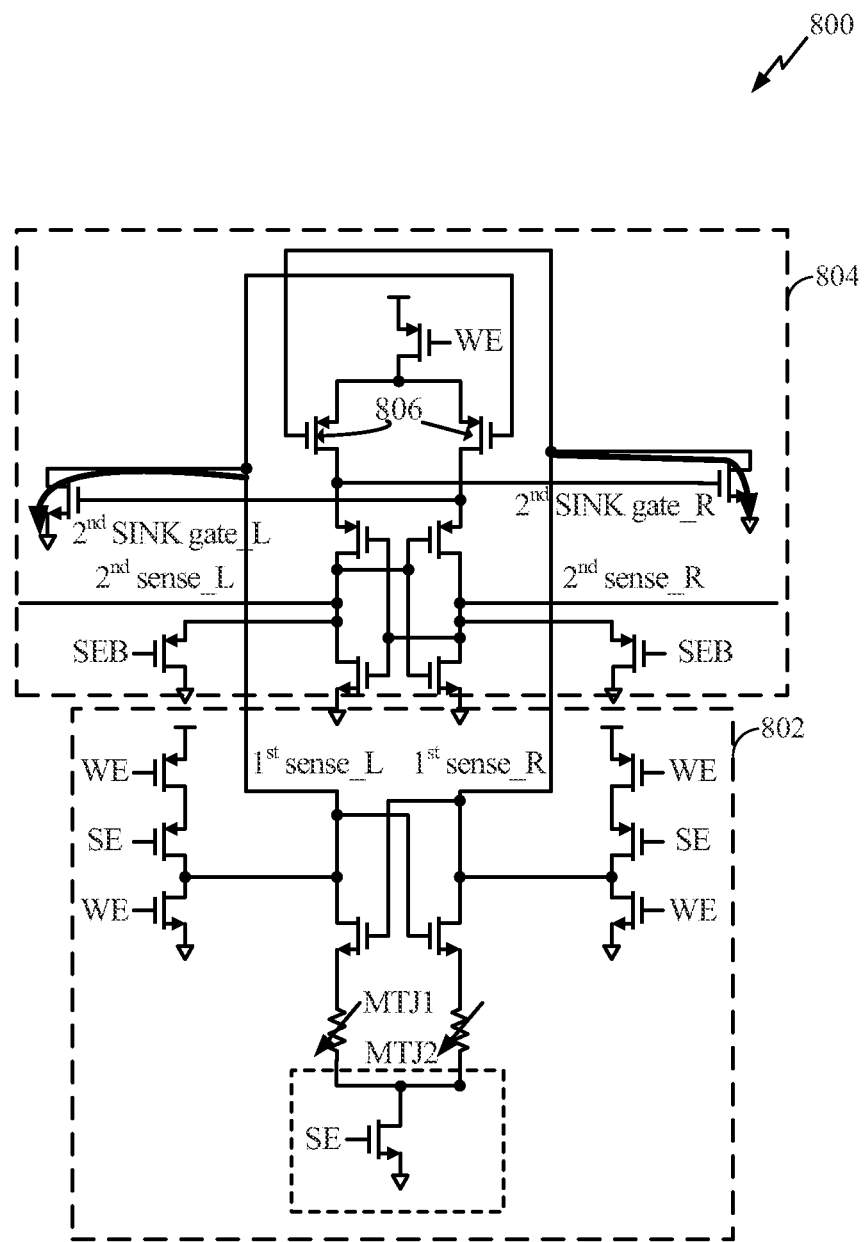
FIG. 8 is a schematic circuit diagram showing a two-stage sensing apparatus according to aspects of the present disclosure.

A low power MTJ non-volatile flip-flop including a two-stage sensing apparatus 800 according to aspects of the present disclosure is described with reference to FIG. 8. A first stage 802 of the two stage sensing apparatus 800 includes NMOS transistors and MTJs to sense the resistance difference of the two MTJs. The second stage 804 consists of a pair of PMOS transistors 806 and a cross-coupled inverter to amplify the output of the first stage 802. The output of the first stage 802 is initially precharged to VDD and determined by the resistance difference of the two MTJs when the sensing operation starts. Because the first stage 802 does not have a pull-up path to VDD, the first stage 802 does not have a DC path from VDD to ground (GND) during the sensing operation. The second stage 804 amplifies the output of the first stage 802.

According to aspects of the present disclosure, the sensing apparatus 800 uses a slow sense enable (SE) signal slope. This can reduce the peak sensing current in the first stage 802 to reduce read disturbance failure probability. However the slow sense enable signal slope can lead to an increase in the sensing current duration of the first stage 802, which increases the read disturbance failure probability.

According to another aspect of the present disclosure, a secondary current path is added to reduce the sensing current duration of the first stage 802. The output sensed at the first stage 802 controls the gate voltage of the second stage PMOS transistors 806. The drain voltages of the second stage PMOS transistors 806 control the gate voltages of the second stage SINK NMOS transistors. Then, the secondary current path for the first stage output occurs through the second stage SINK NMOS transistors and rapidly discharges the first stage output. Thus, the sensing current duration through the MTJs in the first stage 802 can be reduced.

According to aspects of the present disclosure, the low power MTJ non-volatile flip-flop includes two MTJs having the same direction. During a sensing operation, sensing current flows from free layer to fixed layer in the two MTJs. Thus, the read disturbance can occur at the MTJs with state1. The sensing apparatus is constructed using a cross coupled inverter configured with a foot switch.

Figure 9:
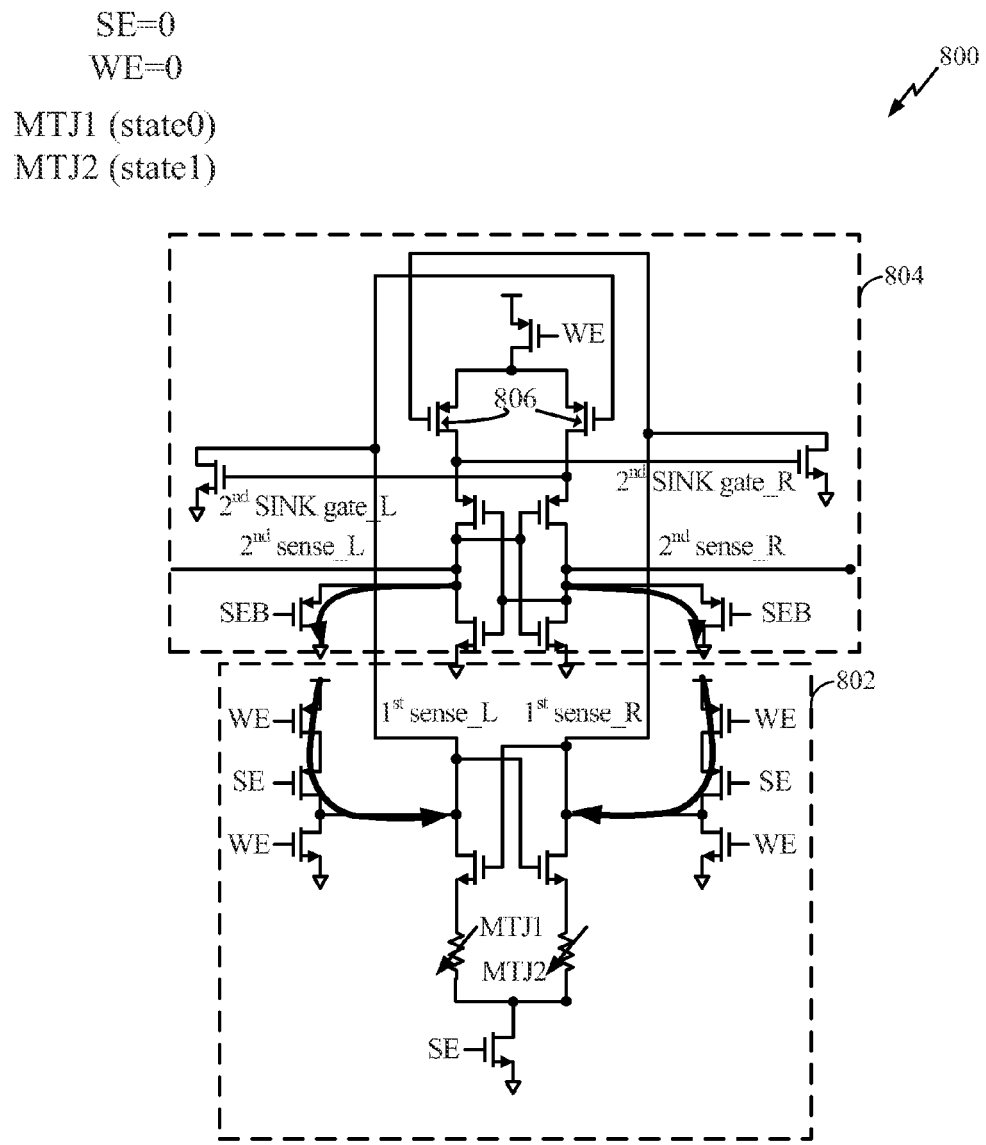
FIG. 9 is a schematic circuit diagram showing operation of a two-stage sensing apparatus according to aspects of the present disclosure.

Operation of the two stage sensing apparatus 800 according to aspects of the present disclosure is described with reference to FIGS. 9-10. Referring to FIG. 9, a sense enable node SE and a write enable node WE are both at logic level 0. When the two stage sensing apparatus 800 is not performing sensing and write operations, outputs of the first stage 802 and second stage 804 are set to VDD and GND, respectively.

Figure 10:
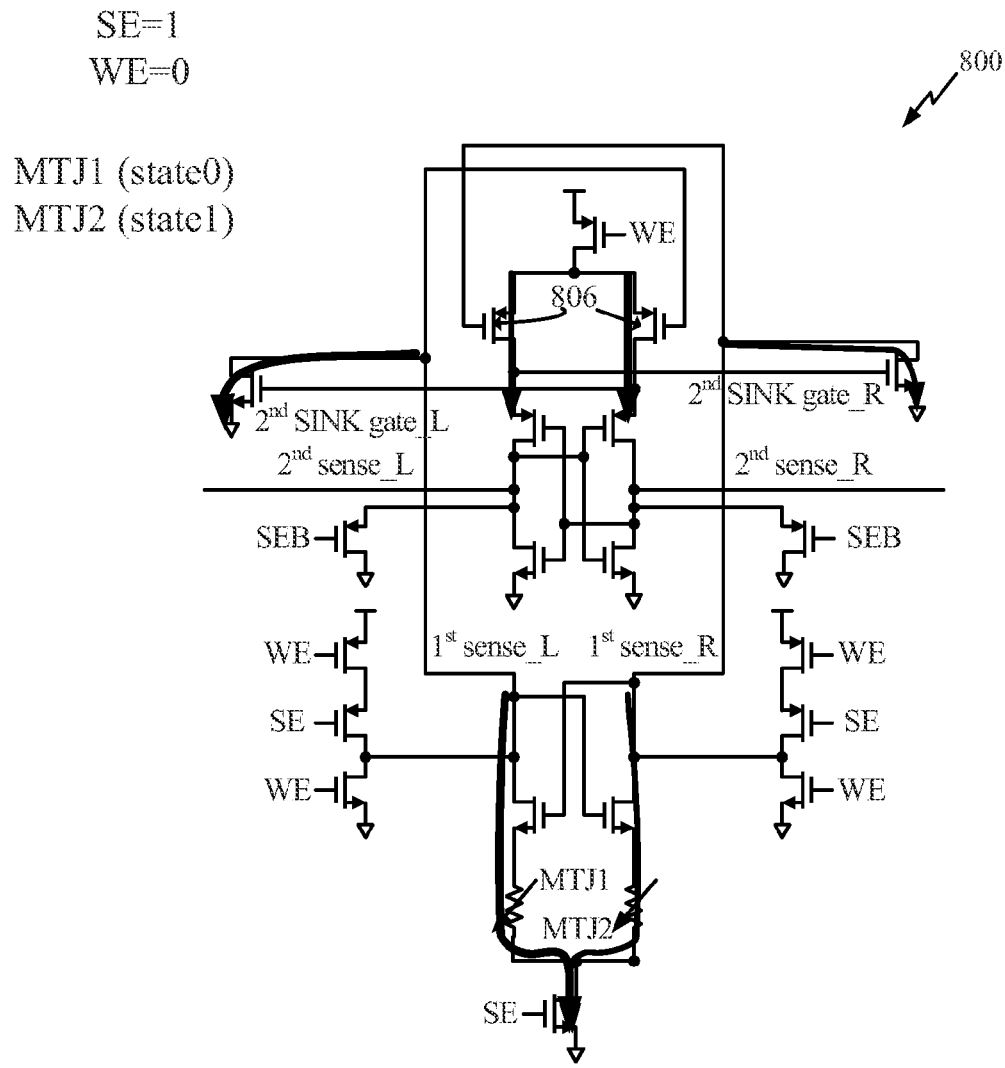
FIG. 10 is a schematic circuit diagram showing operation of a two-stage sensing apparatus according to aspects of the present disclosure.

Referring to FIG. 10, during a sensing operation, the sense enable node is set to SE=1 and the write enable node is set to WE=0. For this description, it is assumed that MTJ1 is in state0 and MTJ2 is in state1 at the beginning of a sense operation. Two outputs are sensed by the current difference determined by the resistance difference of the two MTJs. Initially, the first stage outputs are slowly sensed according to the MTJ resistance difference through the first stage SINK NMOS having the slow SE signal slope. The 1st sense_L output node and 1st sense_R output node are driven to low and high, respectively. Then the low voltage at the 1st sense_L output node turns on one of the second stage PMOS transistors 806. Thus, the second SINK gate_L node is driven to high. On the other band, because the second stage PMOS controlled by high 1st sense_R node is slightly turned on, the second SINK gate_R stays at the low level.

Next, the remaining voltage at 1st sense_L output node is rapidly discharged through first stage SINK NMOS and second stage SINK NMOS. This further turns on the second stage PMOS controlled by 1st sense_R node. Finally, the 2nd sense_L output node and the 2nd sense_R output node become low and high, respectively.

In an alternative configuration according to aspects of the present disclosure, the MTJs are oriented with their free layer facing VDD and their fixed layer facing GND. The main difference from the structure shown in FIGS. 9-10 is that during sensing operations current flows from free layer to fixed layer in the MTJs. Thus, in this configuration, read disturbance can occur at MTJ state1.

According to an aspect of the present disclosure, a low current magnetic tunnel junction (MTJ) flip flop sensing apparatus includes means for simultaneously enabling a first sensing current from a pre-charged first first stage output node through a first MTJ and a second sensing current from a second first stage output node through a second MTJ. The means for simultaneously enabling the first sensing current and the second sensing current can include the sense enable (SE) node as described with reference to FIG. 8, for example. According to another aspect, toe apparatus also includes means for driving a first second stage output node to a high logic state and means for driving a second second stage output node to a low logic state in response to a difference between the first sensing current and the second sensing current. The driving means may include the PMOS transistors 806 as described with reference to FIG. 8, for example.

According to another aspect of the present disclosure, the apparatus also includes means for pre-charging the first first stage output node and the second first stage output node when the first sensing current and the second sensing current are not enabled. The means for pre-charging the first first stage output node and the second first stage output node can include the write enable (WE) nodes and sense enable (SE) nodes within the first stage 802 circuitry as described with reference to FIG. 8, for example.

Figure 11:
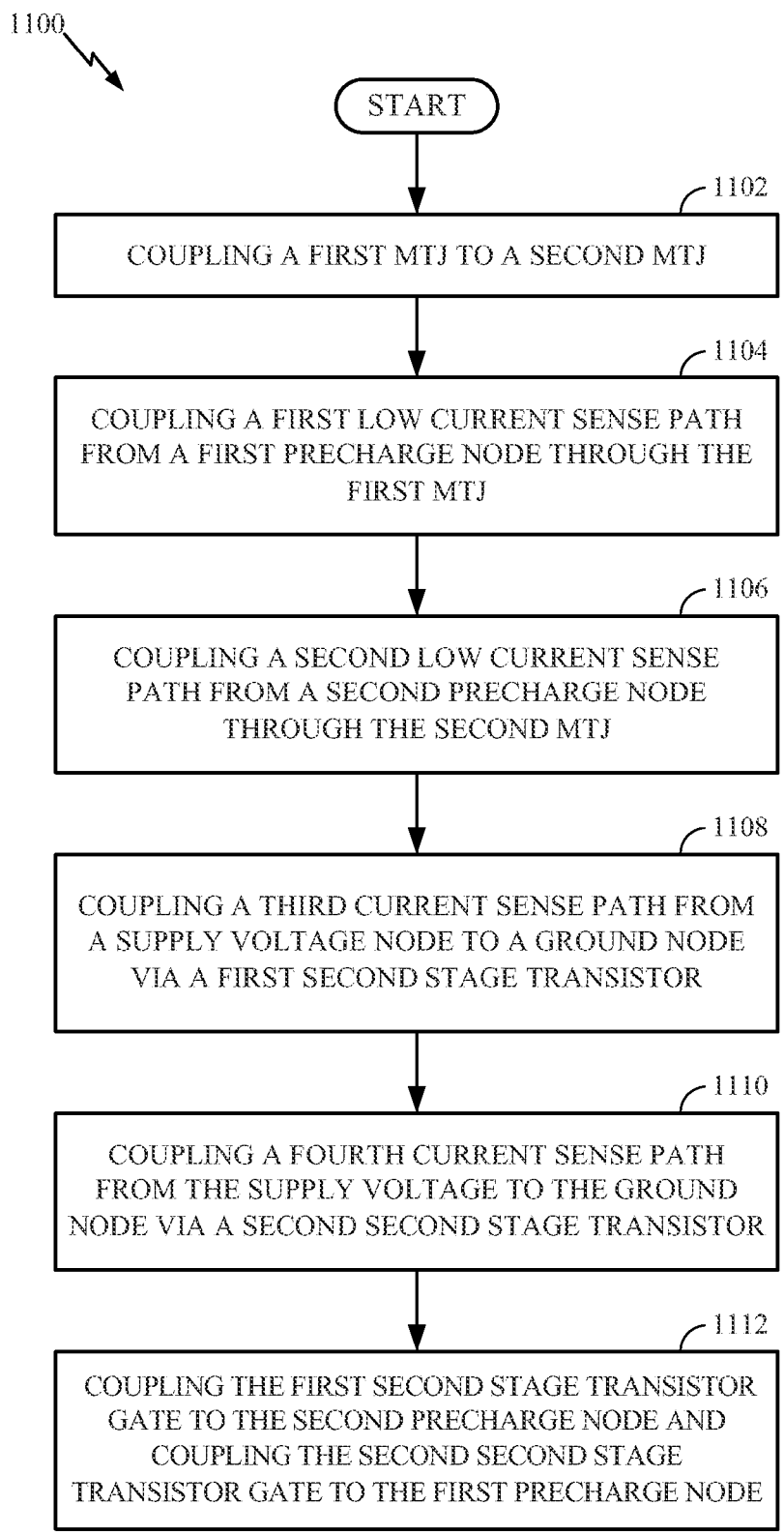
FIG. 11 is process flow diagram illustrating a method of constructing a low-current non-volatile MTJ flip flop with a two-stage sense apparatus according to one aspect of the present disclosure.

FIG. 11 is a process flow diagram illustrating a method of constructing a low-current non-volatile MTJ flip flop with a two-stage sense apparatus according to one aspect of the present disclosure. The method includes coupling a first MTJ to a second MTJ in block 1102 and coupling a first low current sense path from a first precharge node through the first MTJ in block 1104. The method includes coupling a second low current sense path from a second precharge node through the second MTJ in block 1106. The method also includes coupling a third current sense path from a supply voltage node to a ground node via a first second stage transistor in block 1108, and coupling a fourth current sense path from the supply voltage node to the ground node via a second second stage transistor in block 1110. In block 1112, the method couples the first second stage transistor gate of the first second stage transistor to the second precharge node and couples the second second stage transistor gate of the second second stage transistor to the first precharge node.

Figure 12:
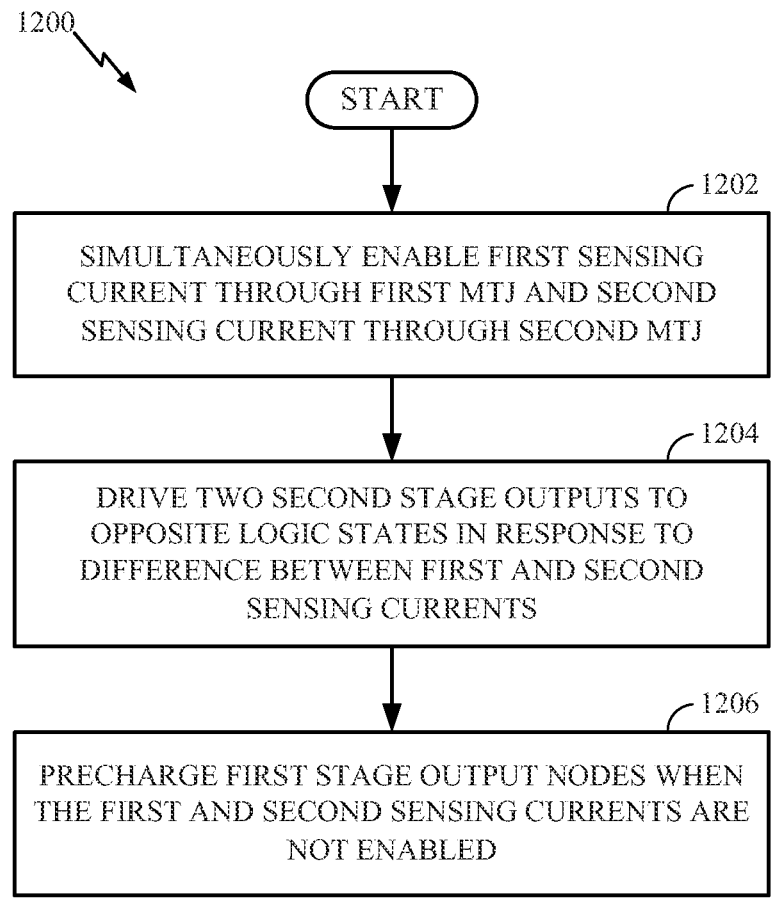
FIG. 12 is process flow diagram illustrating a method of operating a low-current non-volatile MTJ flip flop with a two-stage sense apparatus according to one aspect of the present disclosure.

FIG. 12 is a process flow diagram illustrating a low current magnetic tunnel junction (MTJ) flip flop sensing method 1200 according to an aspect of the present disclosure. The method includes simultaneously enabling a first sensing current from a pre-charged first first stage output node through a first MTJ and a second sensing current from a second first stage output node through a second MTJ in block 1202. The method also includes driving a first second stage output node to a high logic state and driving a second second stage output node to a low logic state in response to a difference between the first sensing current and the second sensing current in block 1204. According to an aspect of the present disclosure, the method also includes pre-charging the first first stage output node and the second first stage output node when the first sensing current and the second sensing current are not enabled in block 1206.

Figure 13:
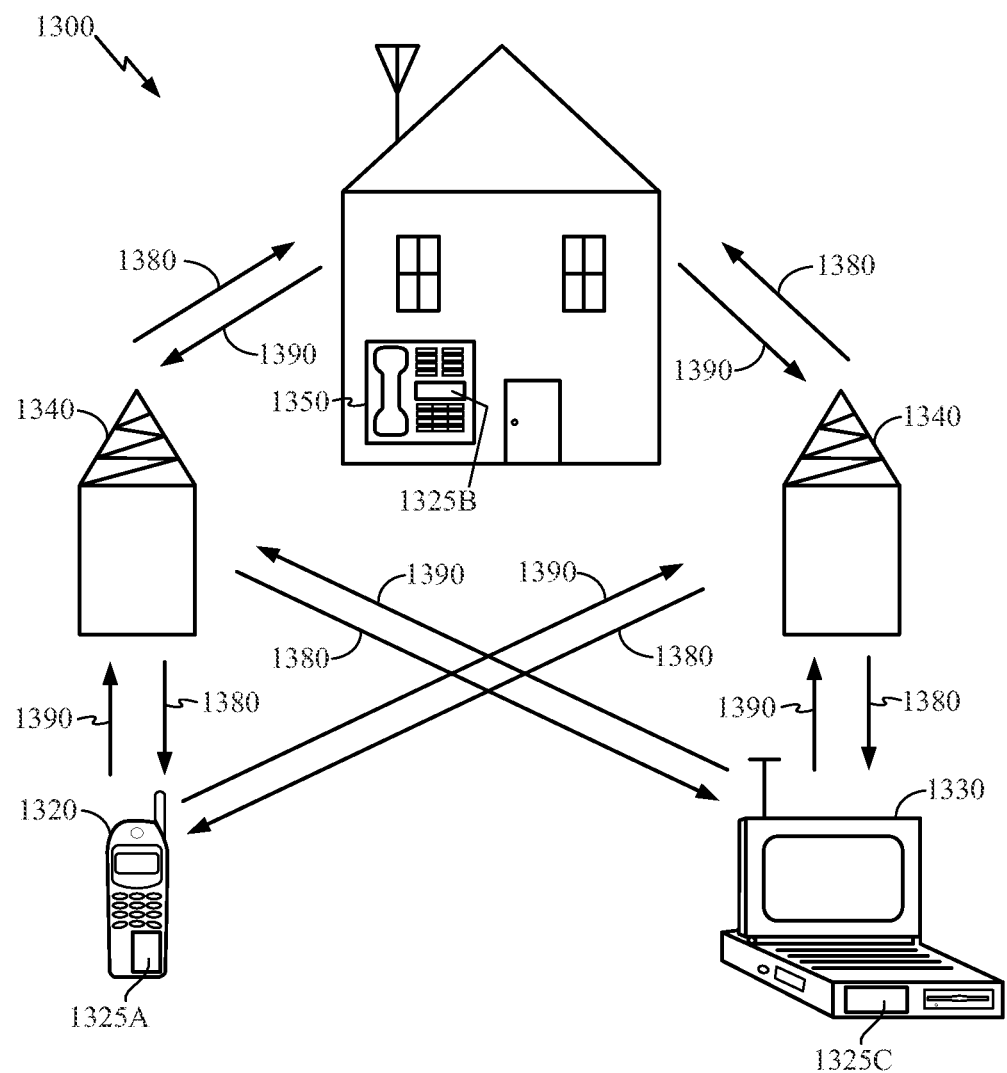
FIG. 13 is a block diagram showing an exemplary wireless communication system in which an aspect of the disclosure may be advantageously employed.

FIG. 13 is a block diagram showing an exemplary wireless communication system 1300 in which an aspect of the disclosure may be advantageously employed. For purposes of illustration, FIG. 13 shows three remote units 1320, 1330, and 1350 and two base stations 1340. It will be recognized that wireless communication systems may have many more remote units and base stations. Remote units 1320, 1330, and 1350 include IC devices 1325A, 1325C and 1325B that include the disclosed two-stage sense amplifier circuitry. It will be recognized that other devices may also include the disclosed two-stage sense amplifier circuitry, such as the base stations, switching devices, and network equipment. FIG. 13 shows forward link signals 1380 from the base station 1340 to the remote units 1320, 1330, and 1350 and reverse link signals 1390 from the remote units 1320, 1330, and 1350 to base stations 1340.

In FIG. 13, remote unit 1320 is shown as a mobile telephone, remote unit 1330 is shown as a portable computer, and remote unit 1350 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 13 illustrates remote units according to the teachings of the disclosure, the disclosure is not limited to these exemplary illustrated units. Aspects of the disclosure may be suitably employed in many devices which include two-stage sense amplifier circuitry.

Figure 14:
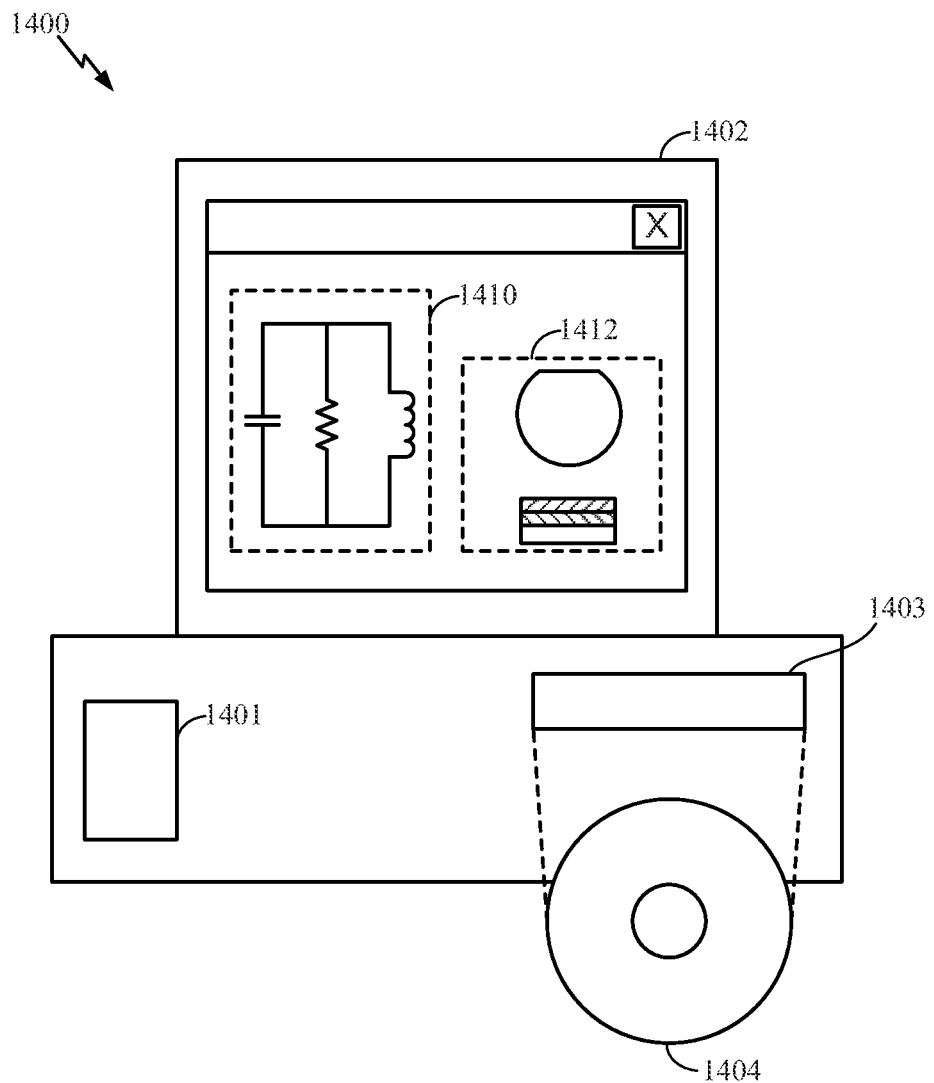
FIG. 14 is a block diagram illustrating a design workstation used for circuit, layout, and logic design of two-stage sense apparatus according to one aspect of the present disclosure.

FIG. 14 is a block diagram illustrating a design workstation used for circuit, layout, and logic design of a semiconductor component, such as the two-stage sense amplifier circuitry disclosed above. A design workstation 1400 includes a hard disk 1401 containing operating system software, support files, and design software such as Cadence or OrCAD. The design workstation 1400 also includes a display 1402 to meditate design of a circuit 1410 or a semiconductor component 1412 such as a two-stage sense amplifier apparatus. A storage medium 1404 is provided for tangibly storing the circuit design 1410 or the semiconductor component 1412. The circuit design 1410 or the semiconductor component 1412 may be stored on the storage medium 1404 in a file format such as GDSII or GERBER. The storage medium 1404 may be a CD-ROM, DVD, hard disk, flash memory, or other appropriate device. Furthermore, the design workstation 1400 includes a drive apparatus 1403 for accepting input from or writing output to the storage medium 1404.

Data recorded on the storage medium 1404 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1404 facilitates the design of the circuit design 1410 or the semiconductor component 1412 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk, storage or other magnetic storage devices, or other medium that can be used to store desired program code to the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A magnetic tunnel junction (MTJ) flip flop apparatus, comprising a first stage including a first MTJ and a second MTJ coupled to the first MTJ, the first stage including a first low current sense path from a first precharge node through the first MT; and a second low current sense path from a second precharge node through the second MTJ; and
    a second stage separate from the first stage, the second stage including a third current sense path from a supply voltage node to a ground node via a first second stage transistor and a fourth current sense path from the supply voltage to the ground node via a second second stage transistor, in which the third current sense path excludes the first precharge node and the fourth current sense path excludes the second precharge node; and wherein the first second stage transistor includes a first second stage transistor gate coupled to the second precharge node, and the second second stage transistor includes a second second stage transistor gate coupled to the first precharge node.

2. The apparatus of claim 1, further comprising:
a first secondary current path between the first precharge node and the ground node; and
a second secondary current path between the first precharge node and the ground node.

3. The apparatus of claim 1, further comprising:
a first sink transistor in the first low current sense path, the first sink transistor including a first sink transistor gate coupled to the second precharge node; and
a second sink transistor in the second low current sense path, the second sink transistor including a second sink transistor gate coupled to the first precharge node;
in which the first low current sense path and the second low current sense path couple to the ground node via a sense enable transistor.

4. The apparatus of claim 1 integrated in a mobile phone, a set top box, a music player, a video player, an entertainment unit, a navigation device, a computer, a hand-held personal communication systems (PCS) unit, a portable data unit, and/or a fixed location data unit.

5. A magnetic tunnel junction (MTJ) flip flop apparatus, comprising:
    a first stage including a first MTJ and a second MTJ coupled to the first MTJ, the first stage including a first low current sense path from a first precharge node through the first MTJ, and a second low current sense path from a second precharge node through the second MTJ;
    a second stage including a third current sense path from a supply voltage node to a ground node via a first second stage transistor and a fourth current sense path from the supply voltage to the ground node via a second second stage transistor;
    a first sink transistor in the first low current sense path, the first sink transistor including a first sink transistor gate coupled to the second precharge node;
    a second sink transistor in the second low current sense path, the second sink transistor including a second sink transistor gate coupled to the first precharge node;
    in which the first low current sense path and the second low current sense path couple to the ground node via a sense enable transistor;
    a first inverter in the third current sense path, the first inverter including a first inverter power node, a first inverter input node and a first sense output node, the first inverter power node coupled to the first second stage transistor, and
    a second inverter in the second low current sense path, the second inverter including a second inverter power node, a second inverter input node and a second sense output node, the second inverter power node coupled to the second second stage transistor;
    in which the first sense output node is coupled to the second inverter input node; and the second sense output node is coupled to the first inverter input node.

6. The apparatus of claim 5, further comprising:
a first secondary current path between the first precharge node and the ground node via a third sink transistor, the third sink transistor including a third sink transistor gate coupled to the second inverter power node; and
a second secondary current path between the first precharge node and the ground node via a fourth sink transistor;
in which the fourth sink transistor includes a fourth sink transistor gate coupled to the first inverter power node.

7. A method of constructing a low current magnetic tunnel junction (MTJ) flip flop apparatus, comprising
coupling a first MTJ to a second MTJ;
coupling a first low current sense path from a first precharge node through the first MTJ;
coupling a second low current sense path from a second precharge node through the second MTJ;

coupling a third current sense path from the supply voltage node to a ground node via a first second stage transistor;

coupling a fourth current sense path from the supply voltage node to the ground node via a second second stage transistor, in which the third current sense path excludes the first precharge node and the fourth current sense path excludes the second precharge node;

coupling a first second stage transistor gate of the first second stage transistor to the second precharge node; and coupling the second second stage transistor gate of the second second stage transistor to the first precharge node.

8. The method of claim 7, further comprising integrating the low current MTJ flip flop apparatus into a mobile phone, a set top box, a music player, a video player, an entertainment unit, a navigation device, a computer, a hand-held personal communication systems (PCS) unit, a portable data unit, and/or a fixed location data unit.

\* \* \* \* \*